United States Patent [19]
Bret

[11] Patent Number: 5,300,834
[45] Date of Patent: Apr. 5, 1994

[54] CIRCUIT WITH A VOLTAGE-CONTROLLED RESISTANCE

[75] Inventor: Gérard Bret, Echirolles, France

[73] Assignee: SGS-Thomson Microelectronics, S.A., Gentilly, France

[21] Appl. No.: 646,945

[22] Filed: Jan. 30, 1991

[30] Foreign Application Priority Data

Jan. 31, 1990 [FR] France .................................. 90 01379

[51] Int. Cl.$^5$ .............................................. H03K 17/60
[52] U.S. Cl. ..................................... 307/570; 307/490; 307/499; 307/296.7
[58] Field of Search ............... 307/570, 495, 490, 501, 307/499, 304, 296.1, 296.5, 296.7, 638; 330/86, 282, 283, 284, 145

[56] References Cited

U.S. PATENT DOCUMENTS

| 3,715,609 | 2/1973 | Hallen ................................ 307/570 |
| 3,986,060 | 10/1976 | Nishizawa et al. .................. 307/304 |
| 4,013,975 | 3/1977 | kataoka et al. ...................... 330/145 |
| 4,737,734 | 4/1988 | Hemingway ........................ 330/278 |
| 4,945,266 | 7/1990 | Mori .................................. 307/638 |

FOREIGN PATENT DOCUMENTS

0210067 1/1987 European Pat. Off. .

OTHER PUBLICATIONS

Nay and Budak, "A Voltage-Controlled Resistance with Wide Dynamic Range and Low Distortion" IEEE Transactions on Circuits and Systems, vol. CAS-30, No. 10, Oct. 1983, pp. 770-772.

Primary Examiner—William L. Sikes
Assistant Examiner—Toan Tran
Attorney, Agent, or Firm—Lowe, Price, LeBlanc & Becker

[57] ABSTRACT

A circuit with a voltage-controlled variable resistance comprises a MOS transistor (2), one of the main electrodes (S) of which is connected to a common terminal (B), a control voltage (VC) being applied between its control electrode (G) and the common terminal. This circuit comprises a voltage dividing bridge (R1, R2) switched between a first terminal (A) and a common terminal (B) and a follower (6, 4), the input of which receives the output (5) of the divider (R1, R2) and the output (8) is connected to the other main electrode (D) of the MOS transistor; whereby the resistance between the first terminal (A) and the common terminal (B) varies as a function of the control voltage (VC).

4 Claims, 1 Drawing Sheet

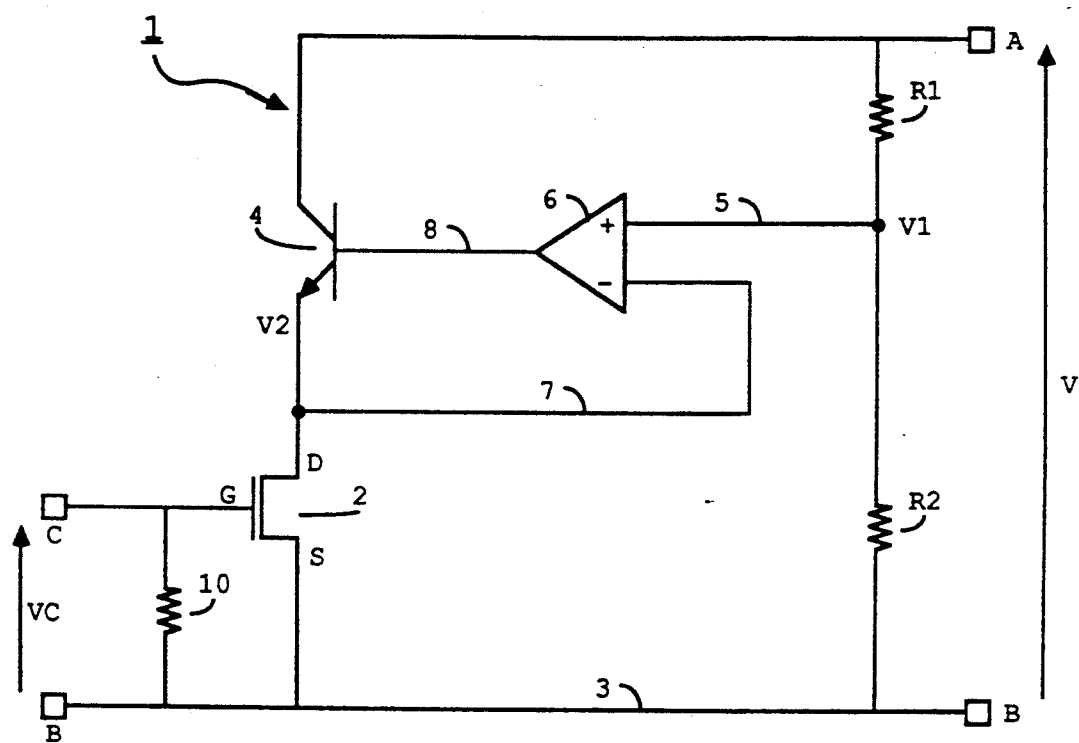

5,300,834

CIRCUIT WITH A VOLTAGE-CONTROLLED RESISTANCE

BACKGROUND OF THE INVENTION

The present invention relates to variable resistor circuits, the resistance of which is controlled by an electric signal, more particularly a voltage.

A variable resistor circuit is generally constituted by a dipole, the resistance or impedance of which takes a determined value as a function of an electric variable, for example a voltage, applied across the terminals of the circuit.

Variable resistor circuits are frequently used in many electronic devices. They are used, for example, for controlling a current or a voltage, for setting a gain or attenuation, or for adjusting filter parameters.

A variable resistor circuit can be formed by using a MOS-type transistor. In a MOS transistor, the resistance between the two main electrodes varies as a function of the voltage applied to the control electrode. In other words, the resistance between the drain and source of a MOS transistor varies as a function of the voltage applied between the gate and the source. Therefore, a simple MOS transistor is liable to constitute a satisfactory voltage-controlled variable resistance. Such a variable resistor circuit properly operates only if the MOS transistor constantly remains in the linear area of the drain-source current voltage characteristic. If the drain-source voltage exceeds a determined value, depending on the physical characteristics of the MOS transistor, the circuit is no longer in the linear area of its characteristic but enters the saturation area wherein the drain-source current does not proportionally varies with the drain-source voltage. Hence, a MOS transistor can be used for constituting a voltage-controlled resistor only if the maximum voltage liable to be applied across the terminals of the variable resistor, that is, between the drain and source, remains lower than the voltage corresponding to the start of the MOS transistor saturation.

However, in many conventional electronic circuits, a large number of different functions is implemented in a single integrated circuit. Particularly, it is presently possible to interconnect in a same chip bipolar transistors and MOS transistors. In some applications, bipolar transistors are to withstand high voltages, for example about 50 volts, and MOS transistors are to withstand substantially lower voltages, for example about 5 volts. It will be easily understood that in such an integrated circuit it will not be possible to use a MOS transistor for constituting a variable resistor if the latter is designed to be connected to a portion of the circuit constituted by bipolar transistors liable to supply substantially higher voltages.

One of the aims of the invention is to solve this problem.

SUMMARY OF THE INVENTION

Therefore, the invention relates to a circuit with a voltage-controlled variable resistance comprising a MOS transistor, one of the main electrodes of which is connected to a common terminal, a control voltage being applied between its control electrode and the common terminal.

According to the invention, the circuit comprises:

a voltage dividing bridge switched between a first terminal and the common terminal; and a follower circuit, the input of which receives the output of the divider, the output of which is connected to the other main electrode of the MOS transistor;

whereby the resistance between the first terminal and the common terminal varies as a function of the control voltage.

According to an embodiment of the invention, the circuit comprises:

an operational amplifier, one of the inputs of which is connected to the divider output, and the other input is connected to the other main electrode of the MOS transistor; and a transistor, the control electrode of which is connected to the amplifier output, one of the main electrodes of which is connected to the first terminal and the other main electrode is connected to other main electrode of the MOS transistor.

According to an embodiment of the invention, the MOS transistor is of the NMOS-type and the transistor is an NPN-type bipolar transistor.

According to an embodiment of the invention, the MOS transistor is of the PMOS-type and the transistor is a PNP-type bipolar transistor.

BRIEF DESCRIPTION OF THE DRAWING

The foregoing and other objects, features and advantages of the invention will be apparent from the following detailed description of a preferred embodiment as illustrated in the single figure.

DETAILED DESCRIPTION OF THE INVENTION

In the figure, the variable resistor circuit 1 constitutes a dipole having two terminals A and B. A voltage V can be applied between terminals A and B, and the resistance R appearing between terminals A and B is a variable resistance controlled by a voltage VC applied to the circuit 1 between a control terminal C and terminal B.

The variable resistor circuit 1 comprises a MOS transistor 2, the source S of which is connected to a line 3 connected to terminal B, the drain D is connected to the emitter of an NPN bipolar transistor 4 and the gate G to the control terminal C. Between terminals A and B is arranged a voltage dividing bridge comprised of two series resistors R1 and R2. The junction of the two resistors constitutes the output 5 of the voltage dividing bridge which is at a voltage V1. The output 5 of the divider is connected to the non-inverting input of an amplifier 6, the inverting input of which is connected through a line 7 to the drain D of the MOS transistor. The output 8 of the operational amplifier 6 is connected to the base of transistor 4, the collector of which is connected to terminal A and the emitter to drain D of the MOS transistor. A resistor 10 can be arranged between terminals C and B if the control signal is a current.

The variable resistor circuit 1 operates as follows. If a voltage V is applied between terminals A and B, a lower voltage V1 is established at the output 5 of the voltage dividing bridge R1 and R2. The value of resistors R1 and R2 is chosen so that, for the maximum value of voltage V, voltage V1 remains lower than the highest drain-source voltage within the linear mode operating range of the MOS transistor 2. Amplifier 6 and transistor 4 are mounted as a follower, that is, transistor 4 allows a current to flow between the collector and the emitter so that the emitter voltage V2 applied to the drain D of the MOS transistor remains substantially equal to voltage V1. Then, it can be seen that voltage V2 will change as a function of the input voltage V while constantly remaining within the range corresponding to the linear operation mode of MOS transistor 2. Thus, the control voltage VC applied between the gate of the MOS transistor and terminal B will control in a determined way the resistance between the drain and source of the MOS transistor, since the latter will always remain within its linear operation range.

A simple calculation shows that the equivalent resistance R between terminals A and B is:

$$R = (R1+R2)/(1+R2/Rm)$$

where

R1 and R2 are the values of resistors R1 and R2,

Rm is the resistance value between drain and source of the MOS transistor. The latter depends on the control voltage VC.

It can be seen that the variable resistor circuit according to the invention is liable to withstand across its terminals a voltage V substantially higher than voltage V2 that the MOS transistor can withstand. For example, if the voltage V2 that can be withstood by the MOS transistor 2 between its drain and source in order that the latter remains within its linear operation range is 5 volts, and if the maximum voltage between terminals A and B is 50 volts, it suffices to choose the values of R1 and R2 so that (R1+R2)/R2=10. Of course, the bipolar transistor 4 as well as the components of amplifier 6 must be capable of withstanding such a voltage V. In fact, there are numerous applications, for example in the integrated circuits including in a same chip bipolar transistors and MOS transistors, wherein one preferably realizes bipolar transistors withstanding high voltages and MOS transistors withstanding much lower voltages. The invention can then be advantageously applied in such circuits.

The choice of resistors R1 and R2 is not made only by considering the ratio (R1+R2.)/R2, as mentioned above, but by considering also the value R1+R2 that has to be substantially higher than R, so that the resistance R of the circuit can vary within a large range as a function of the control voltage VC. In fact, insofar as amplifier 6 has a high gain, a high value can be chosen, at least for resistor R1.

In the above exemplary embodiment, terminal A is designed so as to be at a positive voltage and terminal B at a negative voltage. In that case, transistor 4 is of the NPN-type. Of course, it is possible to devise a similar circuit wherein terminal A is at a negative voltage, transistor 4 being in that case a PNP transistor. It is also possible to provide a follower circuit 6, 4 only comprising MOS transistors. In that case, the variable resistor circuit according to the invention can, for example, be used in an integrated circuit realized according to MOS technology.

The invention can be implemented, for example in a frequency filter circuit, the frequency or quality coefficient of which can be adjusted. In that case, several variable resistors are generally used for realizing filter time constants. The variable resistances have to present very similar or correlated electric characteristics. For this reason, it is advantageous that all the variable resistors of a filtering circuit are realized on one integrated circuit, which can be easily achieved by using the variable resistor circuit according to the invention.

I claim:

1. A voltage-controlled variable resistance circuit comprising:

a MOS transistor having main electrodes and a control electrode, one of the main electrodes connected to a common terminal, a control voltage, sufficient to render said MOS transistor conductive, being applied between said control electrode and the common terminal;

a voltage dividing bridge connected between a first terminal and said common terminal and having an output;

a follower circuit, having an input connected to an output of the voltage dividing bridge and an output connected to a second main electrode of the MOS transistor;

whereby the resistance between the first terminal and the common terminal varies as a function of the control voltage; and wherein said follower circuit comprises:

an operational amplifier having one input connected to the output of the divider and a second input connected to the second main electrode of the MOS transistor; and a transistor having a control electrode connected to the amplifier output, a first main electrode connected to the first terminal and a second main electrode connected to the second main electrode of the MOS transistor.

2. A circuit according to claim 1, wherein said MOS transistor is of the NMOS-type and said transistor is of the bipolar NPN-type.

3. A circuit according to claim 1, wherein said MOS transistor is of the PMOS-type and said transistor is of the bipolar PNP-type.

4. A circuit according to claim 2, wherein said circuit is part of an integrated circuit type comprising bipolar components and MOS components on one chip.

* * * * *